United States Patent
Kuo et al.

(10) Patent No.: US 10,672,652 B2
(45) Date of Patent: Jun. 2, 2020

(54) GRADIENT ATOMIC LAYER DEPOSITION

(71) Applicant: Taiwan Semiconductor Manufacturing Company, Ltd., Hsinchu (TW)

(72) Inventors: Chia-Pang Kuo, Taoyuan (TW); Ya-Lien Lee, Baoshan Township (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/022,986

(22) Filed: Jun. 29, 2018

(65) Prior Publication Data
US 2020/0006132 A1    Jan. 2, 2020

(51) Int. Cl.
*H01L 21/44* (2006.01)
*H01L 21/768* (2006.01)
*H01L 21/285* (2006.01)
*H01L 23/532* (2006.01)

(52) U.S. Cl.
CPC .. *H01L 21/76862* (2013.01); *H01L 21/28556* (2013.01); *H01L 21/76802* (2013.01); *H01L 21/76846* (2013.01); *H01L 23/53238* (2013.01); *H01L 21/76877* (2013.01)

(58) Field of Classification Search
CPC ......... H01L 21/76862; H01L 21/76802; H01L 23/53238; H01L 21/28556; H01L 21/76846; H01L 21/76877
See application file for complete search history.

(56) References Cited

U.S. PATENT DOCUMENTS

| | | | | |
|---|---|---|---|---|
| 6,812,126 B1* | 11/2004 | Paranjpe | ............ | H01L 21/2855 257/E21.168 |
| 2005/0095763 A1* | 5/2005 | Samavedam | ..... | H01L 21/28079 438/197 |
| 2006/0006542 A1* | 1/2006 | Lee | ................. | H01L 21/28562 257/761 |
| 2006/0063395 A1* | 3/2006 | Lee | ................ | C23C 16/34 438/785 |
| 2006/0068104 A1* | 3/2006 | Ishizaka | ................ | C23C 16/34 427/248.1 |
| 2006/0121724 A1* | 6/2006 | Yue | .................... | H01L 21/2855 438/625 |
| 2006/0244079 A1* | 11/2006 | Wang | ................... | H01L 21/845 257/407 |
| 2007/0026621 A1* | 2/2007 | Cho | ................. | H01L 27/10852 438/314 |
| 2007/0040275 A1* | 2/2007 | Lee | ....................... | C23C 16/34 257/751 |
| 2007/0059929 A1* | 3/2007 | Cho | ....................... | C23C 16/36 438/681 |

(Continued)

OTHER PUBLICATIONS

M. Sode, et al. "Ion chemistry in H2-Ar low temperature plasmas," Journal of Applied Physics 114, 063302, Published Aug. 8, 2013, 17 pages.

*Primary Examiner* — Ismail A Muse
(74) *Attorney, Agent, or Firm* — Slater Matsil, LLP

(57) ABSTRACT

A method for forming a semiconductor device includes forming a barrier layer over a dielectric layer, a concentration of an impurity in the barrier layer increasing as the barrier layer extends away from the dielectric layer; and performing a plasma process to treat the barrier layer.

20 Claims, 13 Drawing Sheets

(56) References Cited

U.S. PATENT DOCUMENTS

| | | | |
|---|---|---|---|
| 2007/0075427 A1* | 4/2007 | Lavoie | H01L 21/28562 257/750 |
| 2007/0166970 A1* | 7/2007 | Triyoso | H01L 21/28088 438/585 |
| 2007/0218683 A1* | 9/2007 | Ishizaka | C23C 16/32 438/648 |
| 2010/0078820 A1* | 4/2010 | Kurokawa | H01L 21/76843 257/751 |
| 2011/0006354 A1* | 1/2011 | Jangjian | H01L 29/4966 257/314 |
| 2012/0015517 A1* | 1/2012 | Oshida | H01L 21/76883 438/667 |
| 2012/0100308 A1* | 4/2012 | Milligan | C23C 16/36 427/569 |
| 2012/0305522 A1* | 12/2012 | Park | H01L 45/06 216/13 |
| 2014/0072796 A1* | 3/2014 | Malone | H01B 1/02 428/319.1 |
| 2015/0235954 A1* | 8/2015 | Chang | H01L 23/53238 257/751 |
| 2015/0247241 A1* | 9/2015 | Ezure | C23C 16/22 428/446 |
| 2016/0049609 A1* | 2/2016 | Ezure | C23C 16/325 428/446 |
| 2017/0018502 A1* | 1/2017 | Ichinose | H01L 23/5283 |
| 2018/0315647 A1* | 11/2018 | Wang | H01L 21/76864 |
| 2018/0337056 A1* | 11/2018 | Lin | H01L 21/76847 |
| 2019/0058158 A1* | 2/2019 | Wei | H01L 51/5253 |
| 2019/0164887 A1* | 5/2019 | Wang | H01L 23/5283 |
| 2019/0304792 A1* | 10/2019 | Lin | H01L 21/28556 |
| 2020/0006224 A1* | 1/2020 | Wang | H01L 23/5283 |

\* cited by examiner

US 10,672,652 B2

GRADIENT ATOMIC LAYER DEPOSITION

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As feature sizes continue to shrink in advanced processing technologies, it becomes more challenging to form layers in narrow openings with high aspect-ratios.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are discussed in the context of semiconductor device manufacturing, and in particular, in the context of forming the barrier layers of semiconductor devices.

In some embodiments, an atomic layer deposition (ALD) process is used to form a barrier layer, e.g., in an opening of a dielectric layer over a substrate. The ALD process includes a plurality of ALD cycles, with each ALD cycle forming a sublayer of the barrier layer. In some embodiments, the process condition (e.g., a mixing ratio of the precursors, a ratio between a reactant gas flow rate and a precursor flow rate, the temperature, or the like) of the ALD process is changed from a first ALD cycle to a second ALD cycle, such that concentrations (e.g., atomic percentages) of an impurity (e.g., carbon) in the sublayers of the barrier layer gradually change. Particularly, an upper sublayer further from the substrate has a higher concentration of the impurity than a lower sublayer closer to the substrate. After the ALD process, a plasma process is performed to treat the barrier layer. The plasma process reduces the concentration of the impurity in the barrier layer, and improves the density of the barrier layer, in some embodiments. The barrier layer with a gradient concentration of the impurity, formed by the ALD process disclosed herein, advantageously protects the underlying dielectric layer (e.g., a low-K dielectric layer) from the damage caused by the plasma process, and improves the performance of the semiconductor device formed.

Figure 1:
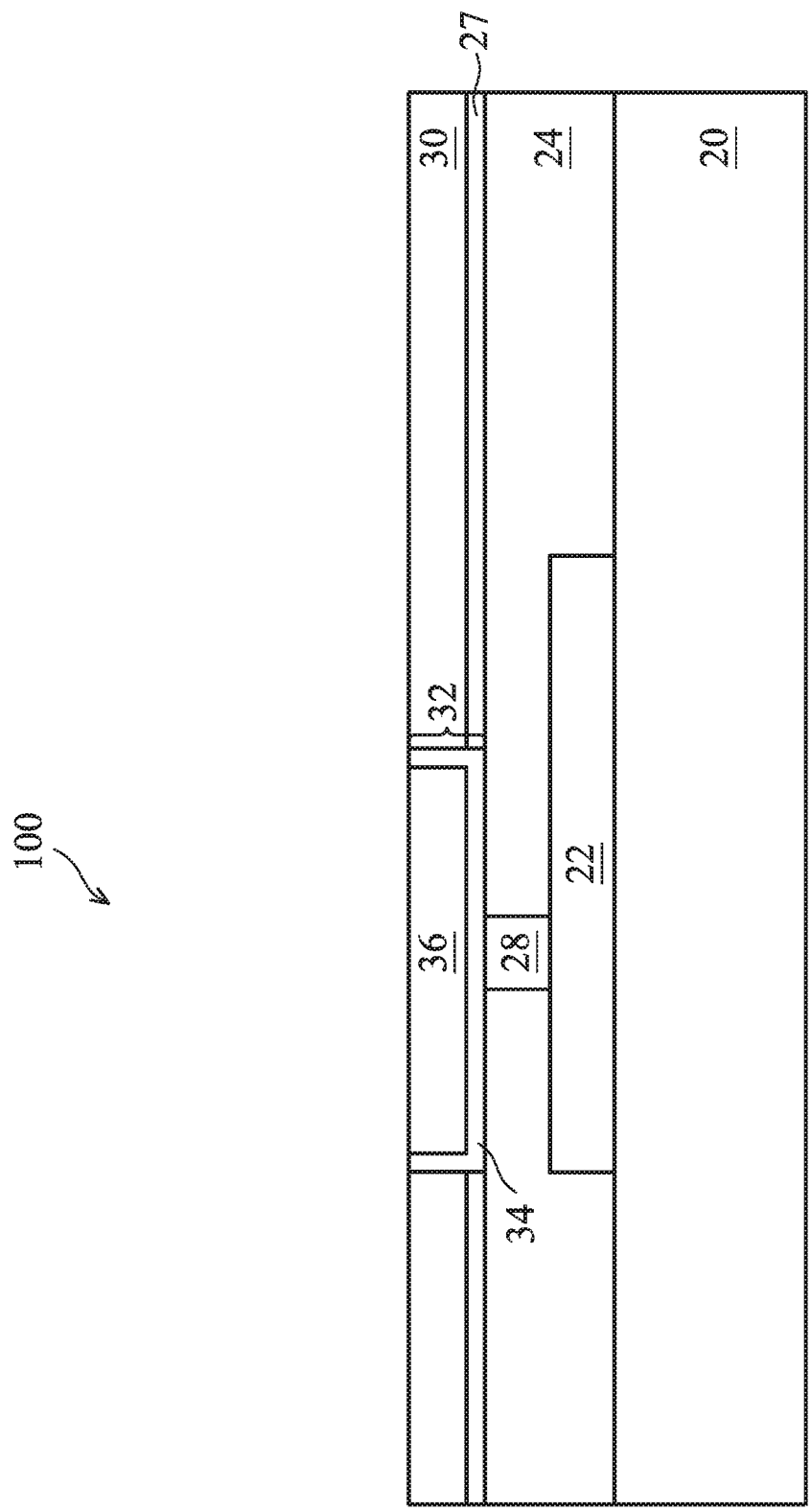
FIGS. 1-3 illustrate cross-sectional views of a semiconductor device at various stages of fabrication, in accordance with an embodiment.

FIG. 1 illustrates a cross-sectional view of a semiconductor device 100 at a stage of fabrication, in an embodiment. The semiconductor device 100 may a device wafer including active devices (e.g., transistors, diodes, or the like) and/or passive devices (e.g., capacitors, inductors, resistors, or the like). In some embodiments, the semiconductor device 100 is an interposer wafer, which may or may not include active devices and/or passive devices. In accordance with yet another embodiment of the present disclosure, the semiconductor device 100 is a package substrate strip, which may be package substrates with cores therein or may be core-less package substrates. In subsequent discussion, a device wafer is used as an exemplary semiconductor device 100. The teaching of the present disclosure may also be applied to interposer wafers, package substrates, or other semiconductor structures.

As illustrated in FIG. 1, the semiconductor device 100 includes a semiconductor substrate 20 and integrated circuit devices 22 (e.g., active devices, passive devices, conductive pads) formed on or in the semiconductor substrate 20. The semiconductor substrate 20 may include a semiconductor material, such as silicon, doped or undoped, or an active layer of a semiconductor-on-insulator (SOI) substrate. The semiconductor substrate 20 may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

In the example of FIG. 1, integrated circuit devices 22 are formed on or in the semiconductor substrate 20. Exemplary integrated circuit devices 22 include transistors (e.g., Complementary Metal-Oxide Semiconductor (CMOS) transistors), resistors, capacitors, diodes, and the like. The integrated circuit devices 22 may be formed using any suitable method, details are not discussed herein.

After the integrated circuit devices 22 are formed, an Inter-Layer Dielectric (ILD) 24 is formed over the semiconductor substrate 20 and over the integrated circuit devices 22. The ILD 24 may fill spaces between gate stacks of the transistors (not shown) in the integrated circuit devices 22. In accordance with some embodiments, the ILD 24 comprises phosphosilicate glass (PSG), borosilicate glass (BSG), boron-doped phosphosilicate glass (BPSG), fluorine-doped silicate glass (FSG), tetraethyl orthosilicate (TEOS), or the like. The ILD 24 may be formed using spin coating, Flowable Chemical Vapor Deposition (FCVD), or the like. In some embodiments, the ILD 24 is formed using a suitable deposition method such as Plasma Enhanced Chemical Vapor Deposition (PECVD), Low Pressure Chemical Vapor Deposition (LPCVD), or the like.

Referring to FIG. 1, contact plugs 28 are formed in the ILD 24, and electrically couples the integrated circuit devices 22 to overlying conductive features such as metal lines, vias, and conductive pillars. In accordance with some embodiments of the present disclosure, the contact plugs 28 are formed of a conductive material such as tungsten, aluminum, copper, titanium, tantalum, titanium nitride, tantalum nitride, alloys thereof, and/or multi-layers thereof. The formation of the contact plugs 28 may include forming contact openings in the ILD 24, filling a conductive material(s) into the contact openings, and performing a planarization process, such as a Chemical Mechanical Polish (CMP), to level the top surface of the contact plugs 28 with the top surface of the ILD 24.

Next, as shown in FIG. 1, an etch stop layer 27 is formed over the ILD 24 and the integrated circuit devices 22. The etch stop layer 27 is formed of a material that has a high etching selectivity relative to an overlying dielectric layer (e.g., 30) and may be used to control (e.g., stop) the etching process of the overlying dielectric layer. The etch stop layer 27 may be formed of silicon carbide, silicon nitride, silicon oxynitride, silicon carbo-nitride, or the like, and may be formed using a suitable deposition process such as physical vapor deposition (PVD), chemical vapor deposition (CVD), combinations thereof, or the like.

Next, an Inter-Metal Dielectric (IMD) layer 30 is formed over the etch stop layer 27. The IMD layer 30 may be formed of a dielectric material such as silicon oxide, silicon nitride, silicon carbide, silicon oxynitride, or the like. In accordance with some embodiments, the IMD layer 30 is formed of a low-k dielectric material having a dielectric constant (k-value) lower than 3.0, such as about 2.5, about 2.0, or even lower. The IMD layer 30 may comprise Black Diamond (a registered trademark of Applied Materials), a carbon-containing low-k dielectric material, Hydrogen SilsesQuioxane (HSQ), MethylSilsesQuioxane (MSQ), or the like. The formation of the IMD layer 30 may include depositing a porogen-containing dielectric material over the etch stop layer 27, and then performing a curing process to drive out the porogen, thereby forming the IMD layer 30 that is porous, as an example. Other suitable method may also be used to form the IMD layer 30.

As illustrated in FIG. 1, conductive lines 32 (e.g., metal lines) are formed in the IMD layer 30. In the illustrated example, the conductive line 32 includes a diffusion barrier layer 34 (may also be referred to as barrier layer) and a conductive material 36 (e.g., copper, or a copper-containing material) over the diffusion barrier layer 34. The diffusion barrier layer 34 may include titanium, titanium nitride, tantalum, tantalum nitride, or the like, and may be formed by CVD, PVD, ALD, or the like. After the diffusion barrier layer 34 is formed, the conductive material 36 is formed over the diffusion barrier layer 34. The formation of conductive line 32 may include a single damascene process, although other suitable formation method may also be used. The conductive line 32 may also be referred to as a metal line hereinafter.

Figure 2:
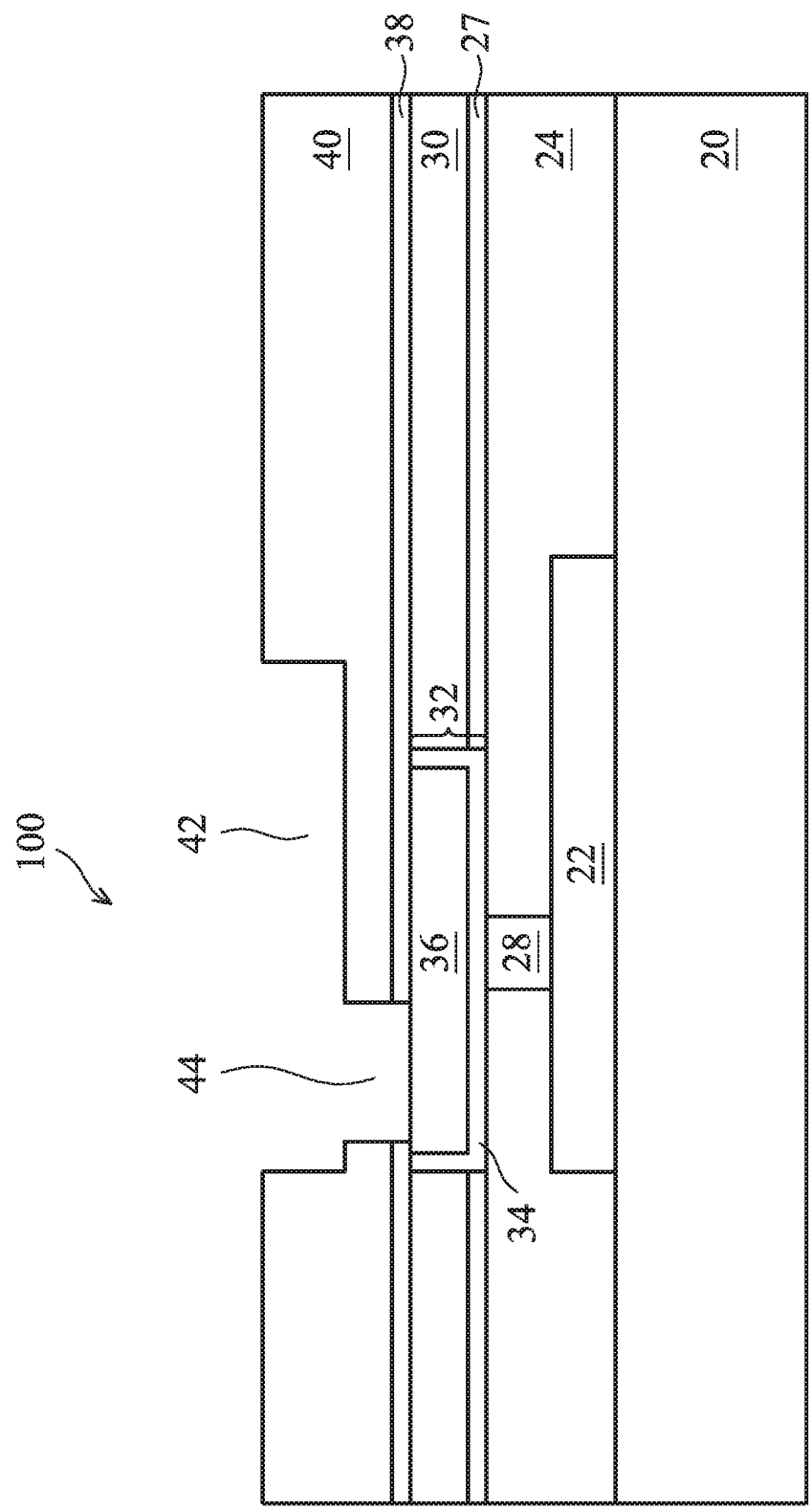

Referring to FIG. 2, an etch stop layer 38 and an IMD layer 40 are formed over the IMD layer 30 and the conductive line 32. The etch stop layer 38 may include a same or similar material as the etch stop layer 27, and may be formed using a same or similar method as the etch stop layer 27, thus details are not repeated. The IMD layer 40 may be formed of a dielectric material (e.g., low-k dielectric material) that is the same as or similar to the IMD layer 30, and may be formed using the same or similar method as the IMD layer 30, thus details are not repeated.

Next, a trench 42 and a via opening 44 are formed in the IMD layer 40. In accordance with some embodiments, the via opening 44 and the trench 42 are formed in two separate etching processes. For example, in a first etching process, the trench 42 is formed in the IMD layer 40. Next, a patterned mask layer (not shown) is formed over the IMD layer 40 and in the trench 42, where the patterned mask layer fills a first portion of the trench 42 while not filling (e.g., leaves empty) a second portion of the trench 42 that overlies the position of the via opening 44. In other words, the patterned mask layer has an opening that corresponds to (e.g., overlies) the location of the (to be formed) via opening 44. Next, a second etching process, such as an anisotropic etching, is performed using the patterned mask layer as a mask. The anisotropic etching removes portions of the IMD layer 40 exposed by the opening in the patterned mask layer, thereby forming the via opening 44. In the example of FIG. 2, after the second etching process, portions of the etch stop layer 38 under the via opening 44 are removed, and the conductive material 36 is exposed by the via opening 44. Other formation methods for forming the trench 42 and the via opening 44 are also possible, and are fully intended to be included within the scope of the present disclosure. The trench 42 and the via opening 44 may be collectively referred to as an opening or a recess in the IMD layer 40.

Figure 3:
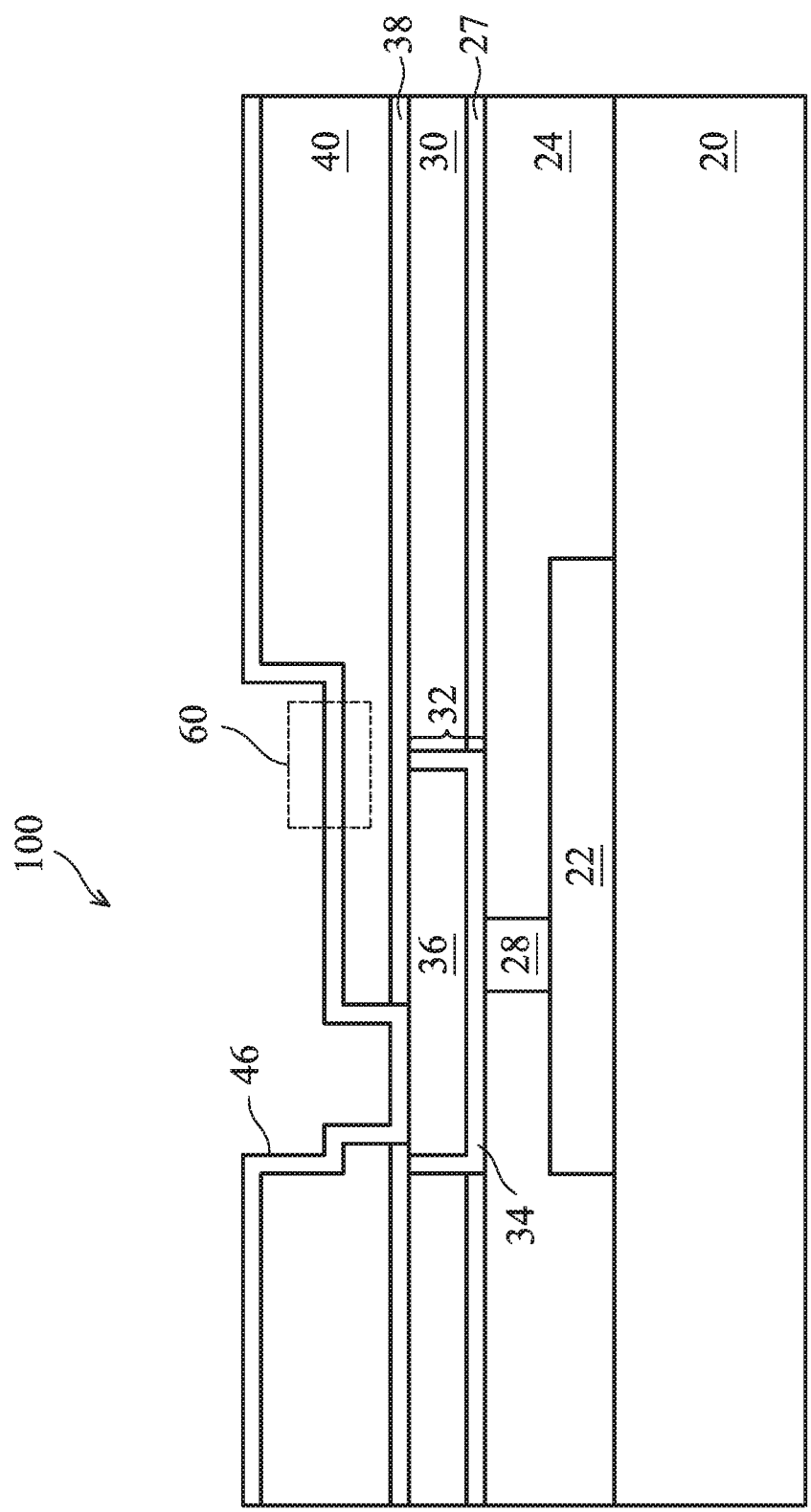

Next, referring to FIG. 3, a diffusion barrier layer 46 (also referred to as a barrier layer) is formed over the IMD layer 40. In the illustrated embodiment, the diffusion barrier layer 46 is conformal and lines sidewalls of the IMD layer 40 exposed by the trench 42 and the via opening 44. The diffusion barrier layer 46 also covers the exposed upper surface of the conductive material 36, as illustrated in FIG. 3. The diffusion barrier layer 46 may include titanium, titanium nitride, tantalum, tantalum nitride, or the like. In an exemplary embodiment, the diffusion barrier layer 46 includes tantalum nitride, and is formed using one of the various embodiment ALD processes, details of which are discussed hereinafter. Discussions herein use tantalum nitride as a non-limiting example material for the diffusion barrier layer 46. The principle of the present disclosure may be applied to diffusion barrier layers formed of other materials.

Figure 4:
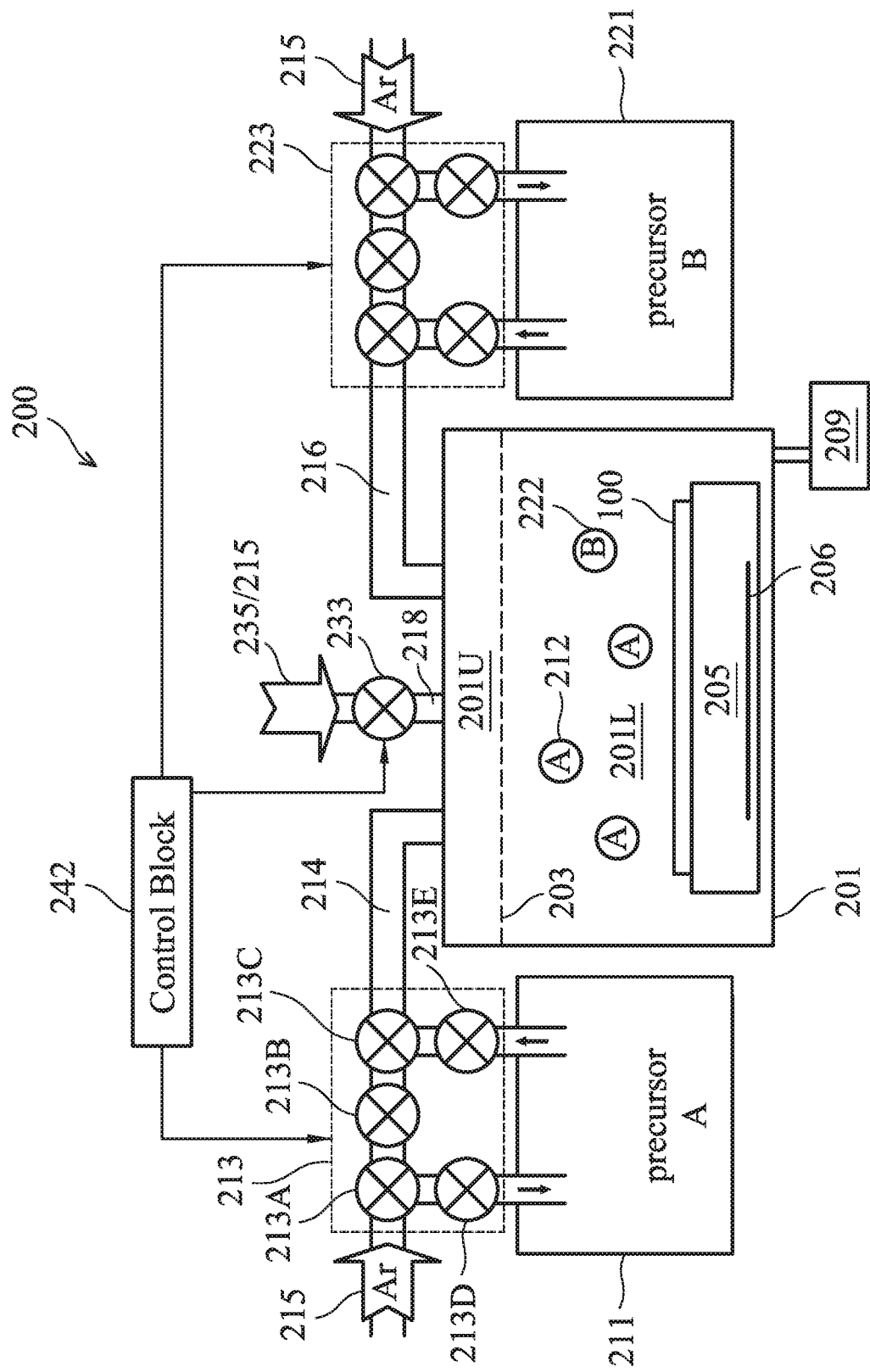
FIG. 4 illustrates a system for forming a barrier layer of the semiconductor device of FIG. 3, in an embodiment.

FIGS. 4, 5A-5C, 6A, 6B, 7A, 7B, and 8 illustrate various embodiment systems and/or methods for forming the diffusion barrier layer 46. Referring to FIG. 4, a diagram of a deposition system 200 for forming the diffusion barrier layer 46 is illustrated. In FIG. 4, the deposition system 200 includes a deposition chamber 201, a gas supply 211 (e.g., a gas tank) for storing a precursor A, and a gas supply 221 (e.g., a gas tank) for storing a precursor B. The gas supplies 211 and 221 are connected to the deposition chamber 201 through respective pipes. A plurality of valve units (e.g., 213, 223, 233) control the flow of the precursor A, the precursor B, a reactant gas 235, and a carrier gas 215 (may also be referred to as a purge gas 215, depending on the intended use of the gas) into the deposition chamber 201. The valve units are controlled by a control block 242. A pump 209 is connected to the deposition chamber 201, which may be used to pump out gas(es) and/or byproducts in the deposition chamber 201. Details of the deposition system 200 are discussed hereinafter.

Referring to FIG. 4, the deposition chamber 201 has a chuck 205 for holding the semiconductor device 100 in place during the ALD deposition process. The chuck 205 may have a heating device 206, such as an electrical heating device, to heat the semiconductor device 100 to a predetermined temperature (e.g., a temperature between about 250° C. and about 350° C.) during the ALD deposition process. The deposition chamber 201 may also have a plate 203 with openings, as illustrated in FIG. 4. The plate 203 divides the deposition chamber 201 into an upper chamber 201U and a lower chamber 201L, where gases (e.g., 214 and 216) supplied into the deposition chamber 201 are mixed in the upper chamber 201U for even distribution into the lower chamber 201L through openings in the plate 203. Therefore, the plate 203 with the openings serves as a shower head. FIG. 4 further illustrates the precursor A (see label 212) and the precursor B (see label 222) in the lower chamber 201L.

Each of the valve units 213/223/233 in FIG. 4 may include one or more interconnected valves with respective input ports and output ports for connection to various input sources (e.g., the precursor A, the precursor B, the carrier gas 215, and/or the reactant gas 235). The output of the valve units 213/223/233 are sent to the deposition chamber 201. The configurations (e.g., the number of valves, the type of values, and the inter-connections of the valves) of the valve units 213/223/233 illustrated in FIG. 4 are for illustration purpose and not limiting. Other configurations are also possible and are fully intended to be included within the scope of the present disclosure.

In the example of FIG. 4, the valve unit 213 includes valves 213A, 213B, 213C, 213D and 213E. In some embodiments, the valve unit 213 is controlled by the control block 242 such that during the purge step (discussion hereinafter) of the ALD cycle, valves 213D and 213E are closed, and valves 213A, 213B and 213C are open, thus allowing the purge gas 215 to pass through valve unit 213 and into the deposition chamber 201. As a result, during the purge step of the ALD process, the gas 214 at the output of the valve unit 213 is the purge gas (e.g., argon (Ar)). In some embodiments, during the precursor pulse step (discussion hereinafter) of the ALD process, the valve 213B is closed, and the valves 213A, 213D, 213E and 213C are open, thus allowing the carrier gas 215 to enter the gas supply 211 (via valves 213A/213D), mix with the precursor A, and leave the valve unit 213 (via valves 213E/213C) toward the deposition chamber 201. Therefore, during the precursor pulse step, the gas 214 at the output of the valve unit 213 is a mixture of the carrier gas 215 and the precursor A, thus the gas 214 may also be referred to as a precursor gas 214 in the context of the precursor pulse step processing. In the illustrated embodiment, the valve unit 223 has a same configuration as the valve unit 213 and are controlled by the control block 242 in the same fashion, thus details may not be repeated. During the purge step, the gas 216 at the output of the valve unit 223 is the purge gas (e.g., Ar). During the precursor pulse step, the gas 216 at the output of the valve unit 223 is a mixture of the carrier gas 215 and the precursor B, and therefore, may also be referred to as a precursor gas 216 in the context of the precursor pulse step processing.

Furthermore, the valve unit 213/223/233 may be controlled by the control block 242 to adjust a flow rate of the gas 214, a flow rate of the gas 235, and/or a flow rate of the gas 218 into the deposition chamber 201. For example, the valve units 213 and 223 may be controlled by the control block 242 to achieve a specific mixing ratio between the precursor gas 214 and the precursor gas 216 (e.g., a ratio between a flow rate of the gas and a second flow rate of a second gas) during the precursor pulse step. The control block 242 may be, e.g., a processor, a computer unit, a control circuit, or the like.

In some embodiments, the precursor A used in the ALD process may be a suitable precursor such as Tris(diethylamido)(tert-butylimido)tantalum(V) (TBTDET), Ta[N(C$_2$H$_5$)$_2$]$_3$NC(CH$_3$)$_3$, or the like. The precursor B used in the ALD process may be a suitable precursor such as Pentakis (dimethylamino)tantalum(V) (PDMAT), Ta[N(CH$_3$)$_2$]$_5$, or the like. As discussed in more details hereinafter, a mixture of the precursor A and precursor B may be used to form some sublayers of the diffusion barrier layer 46 (e.g., tantalum nitride). Some other sublayers of the diffusion barrier layer 46 are formed, however, using only the precursor A or only the precursor B. In the illustrated embodiment, the precursor A is different from the precursor B.

Due to the carbon and other elements in the precursors, the diffusion barrier layer 46 formed using the precursor(s) may not be, e.g., a pure tantalum nitride layer, and instead, may include impurities such as carbon. A molecular composition of the diffusion barrier layer 46 may be represented as TaN$_x$C$_y$H$_z$. Since the precursor A has a higher concentration (e.g., atomic percentage) of carbon than the precursor B, a tantalum nitride layer formed using only the precursor A has a higher concentration (e.g., atomic percentage) of carbon than a tantalum nitride layer formed using only the precursor B, in some embodiments. Therefore, by using both precursor A and the precursor B in the precursor pulse step of the ALD cycle, and by adjusting the mixing ratio of the precursor gas 214 (e.g., comprising the precursor A) and the precursor gas 216 (e.g., comprising the precursor B), the concentration of carbon in the tantalum nitride layer formed may be adjusted.

Figure 5B:
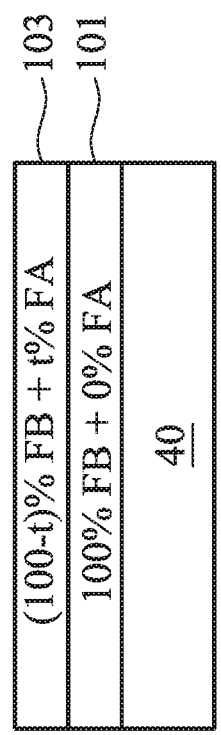
FIGS. 5A-5C illustrate cross-sectional views of a barrier layer of the semiconductor device of FIG. 3 at various stages of fabrication, in an embodiment.
Figure 5A:
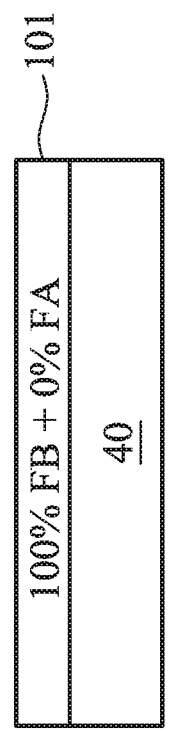
Figure 5C:
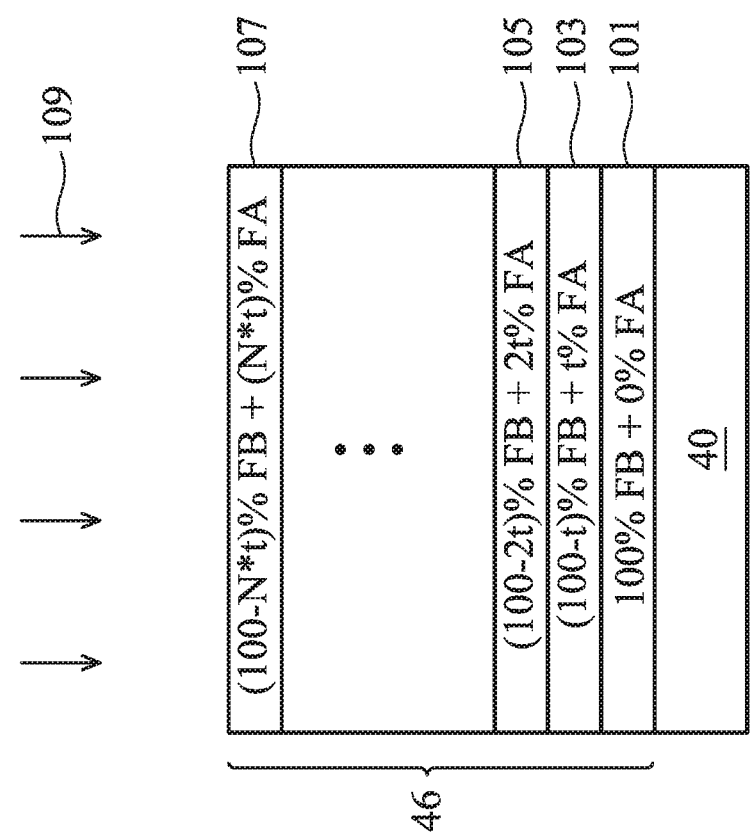

FIGS. 5A-5C illustrate the cross-sectional views of the diffusion barrier 46 at various stages of fabrication using an embodiment ALD process and the deposition system 200 of FIG. 4. The cross-sectional views of FIGS. 5A-5C correspond to an area 60 in FIG. 3. In the various embodiments, the ALD process includes a plurality of ALD cycles performed sequentially, where each ALD cycle includes a plurality of processing steps (also referred to as processing stages). For example, each ALD cycle may include four steps of processing, details of which are discussed below.

Referring temporarily to FIG. 4, in the first step (also referred to as reactant pulse step or reactant pulse stage) of each ALD cycle, a reactant gas 235, which may be ammonia (NH$_3$), is fed into the deposition chamber 201. The reactant gas 235 reacts with the exposed surface of the underlying material (e.g., the IMD layer 40) to form a monolayer. The valve unit 233 is opened in the first step to let in the reactant gas 235, and the valve units 213 and 223 are closed so that no gas flows through the valve units 213 and 223 (e.g., flow rates of the gas 214 and the gas 216 are zero) in the first step.

Next, in the second step (also referred to as a purge step or a purge stage) of the ALD cycle, a purge gas 215, such as Ar, is fed into the deposition chamber 201 to purge (e.g., flush out) the unreacted reactant gas 235 and any byproduct from the first step processing, if any. The pump 209 connected to the deposition chamber 201 may be used to evacuate the unreacted reactant gas 235 and any byproduct out of the deposition chamber 201. In the second step, the valve unit 233 is closed, and the valve units 213/223 are configured to pass the purge gas 215 (e.g., Ar) while preventing the precursors A and B from being fed into the deposition chamber 201, as discussed above.

Next, in the third step (also referred to as precursor pulse step or precursor pulse stage) of the ALD cycle, a mixture of precursors A and B are fed into the deposition chamber 201. Particularly, the precursor A and the precursor B are carried into the deposition chamber 201 by their respective carrier gas 215 (e.g., Ar). The precursor A and the precursor B react with the monolayer formed in the first step to form a sublayer (see, e.g., 101 in FIG. 5A) of the diffusion barrier layer 46. The control (e.g., opening and closing) of the valve units 213/223/233 in the third step may vary depending on the methods used, and will be discussed in more details hereinafter. Note that here, the term "a mixture of precursor A and B" also includes the special cases where only precursor A, or only precursor B, is fed into the deposition chamber 201 in the third step.

Next, in step four (also referred to as purge step or purge stage) of the ALD cycle, the purge gas 215 is fed into the deposition chamber 201 to purge (e.g., flush out) the unreacted precursor(s) and any byproduct from the third step processing, similar to step two. Details are thus not repeated.

As discussed above, each ALD cycle forms a sublayer of the diffusion barrier layer 46, and all of the sublayers (see, e.g., 101, 103, 105 and 107 in FIG. 5C) formed by all of the ALD cycles of the ALD process form the diffusion barrier layer 46 (see FIG. 5C). In some embodiments, the mixing ratio between the precursor gas 214 and the precursor gas 216 (e.g., a ratio between the flow rate of the precursor gas 214 and the flow rate of the precursor gas 216) used in step three of each ALD cycle is adjusted, such that the concentration (e.g., atomic percentage) of carbon in different sublayers of the diffusion barrier layer 46 is changed. Particularly, as the ALD process proceeds with each additional ALD cycle, the mixing ratio between the precursor gas 214 and the precursor gas 216 is increased, such that a sublayer of the diffusion barrier layer 46 formed in a later ALD cycle (e.g., a sublayer further from the IMD layer 40) has a higher concentration of carbon than a sublayer of the diffusion barrier layer 46 formed in an earlier ALD cycle (e.g., a sublayer closer to the IMD layer 40). In other words, the concentration of carbon increases as the diffusion barrier layer 46 extends further from the IMD layer 40.

Referring now to FIG. 5A, a sublayer 101 of the diffusion barrier layer 46 is formed over (e.g., directly on) the IMD layer 40 in a first ALD cycle of the ALD process. Particularly, in step three of the first ALD cycle, only the precursor gas 216 (carrying the precursor B) is fed into the deposition chamber 201 via the valve unit 223, and the precursor A is not fed into the deposition chamber 201 (e.g., valve unit 213 is closed). A flow rate of the precursor gas 216 in step three of the first ALD cycle is FB, where FB is a suitable flow rate for the precursor gas 216 when only precursor B is used for forming the diffusion barrier layer 46. The sublayer 101 is therefore labeled using a notation "100% FB+0% FA" in FIG. 5A to indicate that the flow rate of the precursor gas 216 is at 100% of FB, and the flow rate of the precursor gas 214 is zero (e.g., 0% of FA), where FA is a suitable flow rate for the precursor gas 214 when only precursor A is used for forming the diffusion barrier layer 46. In some embodiments, the concentration of carbon in the sublayer 101 is between about 1 atomic percentage (at %) to about 15 at %.

Note that discussion herein refers to the flow rates of the precursor gases 214 and 216 instead of the flow rates of the precursors A and B. This is because the precursors A and/or B may be in fluid or solid state, in which case the flow rates of the precursor gases 214/216 are more appropriate to use since flow rates of gases may be easily measured and controlled, while the flow rate of fluid or solid precursor carried by the carrier gas may be difficult to measure or control. Note that although not equal, the flow rate of the precursor gas (e.g., 214 or 216) is proportional to the flow rate of the respective precursor it carries, in some embodiments. Therefore, increasing or decreasing the flow rate of the precursor gas (e.g., 214 or 216) correspondingly increases or decreases the flow rate of the respective precursor (e.g., A or B).

Next, in FIG. 5B, a sublayer 103 is formed over the sublayer 101 in a second ALD cycle of the ALD process. In step three of the second ALD cycle, the flow rate of the precursor gas 214 is increased to t % of FA, and the flow rate of the precursor gas 216 is decreased to (100−t)% of FB, where t is a positive number. In other words, the mixing ratio of the precursor gas 214 and the precursor gas 216 is increased from the first ALD cycle to the second ALD cycle. As a result, a mixing ratio of the precursor A and the precursor B is also increased from the first ALD cycle to the second ALD cycle, in some embodiments. Recall that the precursor A has a higher concentration of carbon than the precursor B, the sublayer 103, therefore, has a higher concentration of carbon than the sublayer 101. In FIG. 5B, a notation of "(100−t)% FB+t % FA" is used to label the sublayer 103.

Referring next to FIG. 5C, a third ALD cycle is performed to form a sublayer 105 over the sublayer 103. In the illustrated example, the flow rate of the precursor gas 214 is increased further to 2t % of FA, and the flow rate of the precursor gas 216 is further reduced to (100−2t) % of FB, and the sublayer 105 is labeled using the notation "(100−2t) % FB+2t % FA." Additional ALD cycles are performed to form additional sublayers, with each sublayer formed using a higher flow rate for the precursor gas 214 and a lower flow rate for the precursor gas 216 than a previous sublayer. In other words, the concentration of carbon in each sublayer increases as the ALD process proceeds.

In the last ALD cycle, a topmost sublayer 107 is formed with the flow rate of the precursor gas 214 at (N×t) % of FA, and with the flow rate of the precursor gas 216 at (100−N×t) % of FB. In some embodiments, N×t is equal to 100, which means that the topmost sublayer 107 is formed using only the precursor gas 214 (carrying the precursor A) in step three of the last ALD cycle (e.g., valve unit 223 closed). Therefore, the topmost sublayer 107 has the highest concentration of carbon in all of the sublayers. In an exemplary embodiment, t is equal to 5. Therefore, the flow rates of the precursor gases 214 and 216 change in steps of 5% of their respective reference flow rate (e.g., FA and FB), and the ALD process has a total of 21 ALD cycles. The first ALD cycle uses only the precursor gas 216 in step three, and the last (e.g., the 21st) ALD cycle only uses the precursor gas 214 in step three.

Still referring to FIG. 5C, all of the sublayers formed in all of the ALD cycles of the ALD process form the diffusion barrier layer 46. Since there is a gradient in the concentration of carbon in the diffusion barrier 46 formed, the various ALD processes disclosed herein for forming the diffusion barrier layer 46 are also referred to as gradient ALD processes.

In some embodiments, the precursors A and B are in a same physical state (e.g., liquid, solid, or gas) during the ALD process, in which case the flow rate FA of the precursor gas 214 and the flow rate FB of the precursor gas 216 are substantially equal, and therefore, the total precursor gas flow rate in step three, which is the sum of the flow rate for the precursor gas 214 and the flow rate for the precursor gas 216, is kept at a substantially constant value across different ALD cycles. Therefore, during step three of each of the ALD cycles, the valve unit 233 is closed, and the valve units 213 and 223 are adjusted to pass the precursor gas 214 and the precursor gas 216, respectively, at their respective flow rates.

In some embodiments, the precursors A and B are in different physical states during the ALD process, in which case the flow rate FA of the precursor gas 214 and the flow rate FB of the precursor gas 216 are different. As a result, a same percentage change in the flow rate of the precursor gases (e.g., 214, 216) result in different amounts of flow rate change for the precursor gases, in which case the valve unit 233 may be opened in step three of the ALD cycle to supply additional carrier gas 215 (e.g., Ar) into the deposition chamber 201, such that a total gas flow rate of all the gases (e.g., precursor gas 214, precursor gas 216, and carrier gas 215 passing through the valve unit 233) going into the deposition chamber 201 in step three of the ALD cycle is maintained at a substantially constant value (or above a pre-determined value such as a lower boundary for the total gas flow rate), which may improve the quality of the diffusion barrier layer 46 formed.

To illustrate, consider an example where the precursor A is in liquid state and the flow rate FA for the precursor gas 214 in step three of the ALD cycle is 500 standard cubic centimeters per minute (sccm), and the precursor B is in solid state and the flow rate FB for the precursor gas 216 is 1000 sccm. Assuming the flow rate of the precursor gas 214 increases by 10% (e.g., t=10) between adjacent ALD cycles and the flow rate of the precursor gas 216 decreases by 10% between adjacent ALD cycles. The corresponding reduction of flow rate for the precursor gas 216 is 100 sccm, and the corresponding increase of flow rate for the precursor gas 214 is 50 sccm. Therefore, the valve unit 233 may be opened to inject additional carrier gas 215 into the deposition chamber 201 to compensate for the difference of 50 sccm, such that the total gas flow into the deposition chamber 201 is unchanged. Note that this means that the valve unit 233 may be controlled to select its input source in step three of the ALD cycle, which input source may be the reactant gas 235 or the carrier gas 215.

Still referring to FIG. 5C, after the last ALD cycle of the gradient ALD process is finished, the as-deposited diffusion barrier layer 46 is treated using a plasma process 109. In some embodiments, the plasma process 109 uses a gas source comprising Ar and $H_2$. The gas source is activated into a plasma comprising, e.g., argon ions, hydrogen radicals, and hydrogen ions (e.g., $H3^+$), in some embodiments. After the gas source is activated, the plasma may include $Ar^+$, $ArH^+$, $H3^+$, $H2^+$, and $H^+$.

The plasma process 109 reduces the concentration of the impurity (e.g., carbon) in the diffusion barrier layer 46, and as a result, the density of the diffusion barrier layer 46 is improved, which advantageously improves the capability of the diffusion barrier layer 46 to prevent copper from diffusing into the underlying dielectric layer (e.g., the IMD layer 40), in some embodiments.

During the plasma process 109, the plasma impinges on the diffusion barrier layer 46 and enters the diffusion barrier 46. The plasma reacts with carbon and removes carbon from the diffusion barrier layer 46. In some embodiments, the plasma reacts more easily with carbon than other elements in the diffusion barrier layer 46. Since the sublayers proximate the upper surface of the diffusion barrier layer 46 (referred to as upper sublayers) have higher concentrations of carbon than sublayers proximate the lower surface of the diffusion barrier layer 46 (referred to as lower sublayers), more plasma reacts with carbon in the upper sublayers, and thus, gets consumed in the upper sublayers. Therefore, the upper sublayers act as a shield to reduce the impact of the plasma, and as a result, less plasma travels down and reaches the lower sublayers. This, combined with the factor that the energy of the plasma reduces as it travels deeper into the diffusion barrier layer 46, advantageously reduces the likelyhood that the plasma processing 109 damages the underlying dielectric layer (e.g., a lower-K dielectric layer).

In addition, since the upper sublayers have higher carbon concentrations and are treated heavily by the plasma processing, and since the lower sublayers have lower carbon concentrations and are treated lightly by the plasma processing, after the plasma processing 109 is finished, the diffusion barrier layer 46 has a substantially uniform density. For example, a difference between the density of the topmost sublayer and the density of the lowermost sublayer of the diffusion barrier layer 46 may be less than about 10% of the density of the lowermost sublayer. Having a substantially uniform density may reduce the electrical resistance of the diffusion barrier layer 46. Furthermore, since the plasma processing 109 removes carbon from the diffusion barrier layer 46, the density of the diffusion barrier layer 46 is increased, which reduces the chance of copper diffusing through the diffusion barrier layer 46 into the underlying dielectric layer (e.g., the IMD layer 40).

Figure 6A:
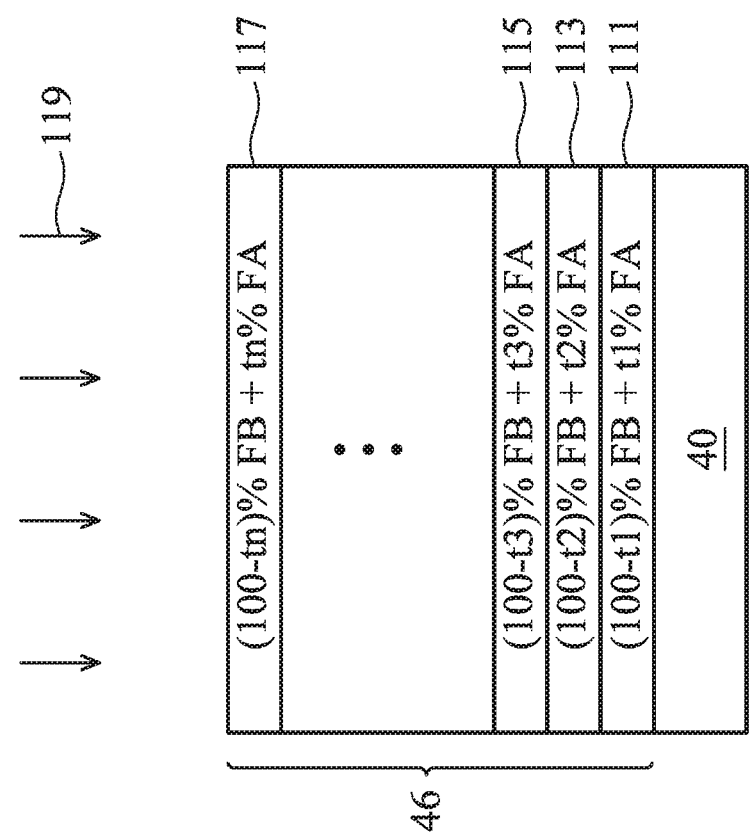
FIGS. 6A and 6B each illustrates a cross-sectional view of an embodiment barrier layer of the semiconductor device of FIG. 3.
Figure 6B:
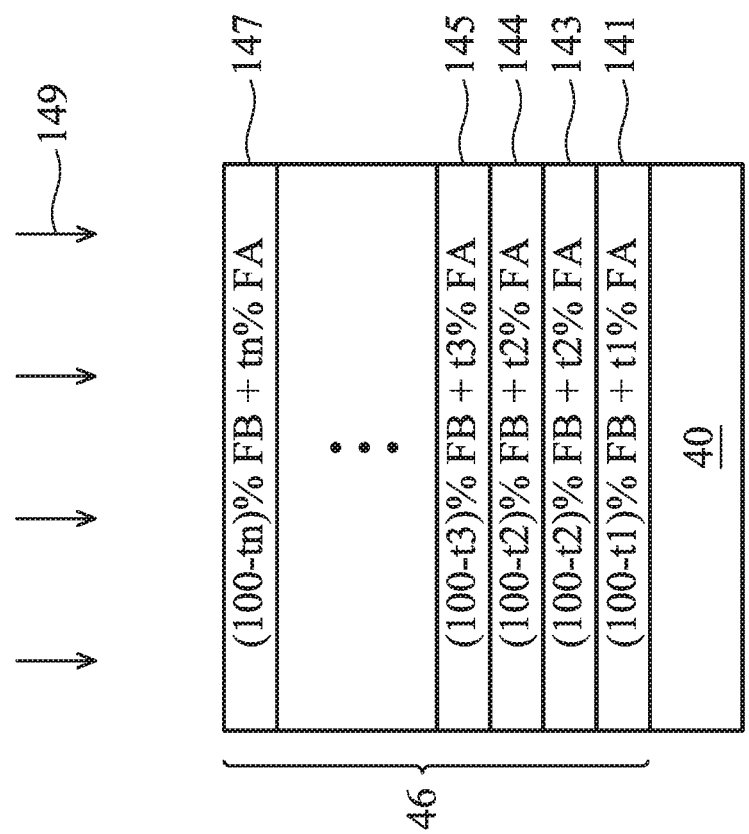

The gradient ALD process illustrated in FIGS. 5A-5C is a non-limiting example, variations and modifications are possible and are fully intended to be included within the scope of the present disclosure. FIGS. 6A and 6B illustrate two additional embodiment gradient ALD processes.

Referring to FIG. 6A, the gradient ALD process illustrated in FIG. 6A is similar to that of FIGS. 5A-5C, but with the mixing ratio of the precursor gases 214 and 216 in step three of each ADL cycle being generalized. For example, while the first sublayer 101 of FIG. 5C is formed using the precursor gas 216 only in step three of the ALD cycle, there is no such requirement in the gradient ALD process of FIG. 6A. Particularly, each of the sublayers (e.g., 111, 113, 115, or 117) in FIG. 6A may be formed by a mixture of the precursor gas 214 and the precursor gas 216, with the flow rate of the precursor gases labeled for each sublayer using the same notation as FIGS. 5A-5C. The gradient ALD process of FIG. 6A allows for any suitable mixing ratio of the precursor gas 214 and the precursor gas 216 to be used, as long as the relationship of $t1<t2<t3 \ldots <tn$ holds, where $t1, t2, t3, \ldots, tn$ are non-negative numbers. In other words, in FIG. 6A, the flow rate of the precursor gas 214 increases as each additional ALD cycle is performed, resulting in an increase in the carbon concentration as each additional sublayer is formed. In addition, while the flow rates of the precursor gases (e.g., 214, 216) change in multiple of t % in the example of FIGS. 5A-5C, the change of flow rates in FIG. 6A can be any suitable number. Once all the sublayer are formed, a plasma process 119, which is the same or similar to the plasma process 109 of FIG. 5C, is performed to treat the as-deposited diffusion barrier layer 46.

In FIGS. 5A-5C and 6A, the carbon concentration of a newly formed sublayer (e.g., the N-th sublayer) is higher than that of a previously formed sublayer (e.g., the (N−1)-th sublayer). In other words, in FIGS. 5A-5C and 6A, a higher sublayer (e.g., further from the IMD layer 40) has a higher concentration of carbon than a lower sublayer (e.g., closer to the IMD layer 40). In other embodiments, the same mixing ratio between the precursor gases 214 and 216 may be used for a plurality of consecutive ALD cycles to form a plurality of consecutive sublayers that have the same carbon concentration, as illustrated in the embodiment of FIG. 6B.

Referring to FIG. 6B, after the sublayer 141 is formed, sublayers 143 and 144 are formed consecutively over the sublayer 141 using a same mixing ratio between the precursor gases 214 and 216 in step three of their respective ALD cycles. As a result, the carbon concentrations of the sublayer 143 and 144 are substantially the same. After the sublayer 144 is formed, a sublayer layer 145 is formed using a flow rate for the precursor gas 214 that is higher than that of the sublayer 144. In FIG. 6B, the same notation as FIG. 5C is used to label each of the sublayers, where t1<t2 <t3 . . . <tn, and t1, t2, t3, . . . , and to are non-negative numbers. The number and the locations of the sublayers (e.g., 143 and 144) having the same carbon concentration, as illustrated in FIG. 6B, are merely examples and not limiting, other numbers of sublayers and other locations for the sublayers having the same carbon concentration are also possible and are fully intended to be included within the scope of the present disclosure. After all the sublayers are formed, a plasma process 149, which is the same as or similar to the plasma process of 109 in FIG. 5C, is performed to treat the as-deposited diffusion barrier layer 46.

Figure 7B:
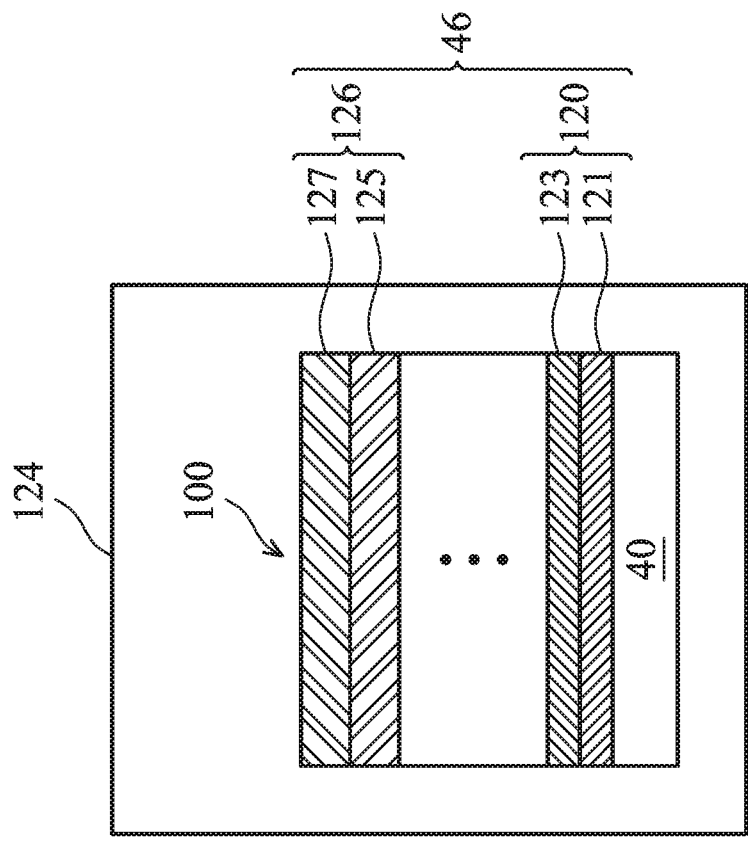
FIGS. 7A and 7B illustrate cross-sectional views of a barrier layer of the semiconductor device of FIG. 3 at various stages of fabrication, in an embodiment.
Figure 7A:
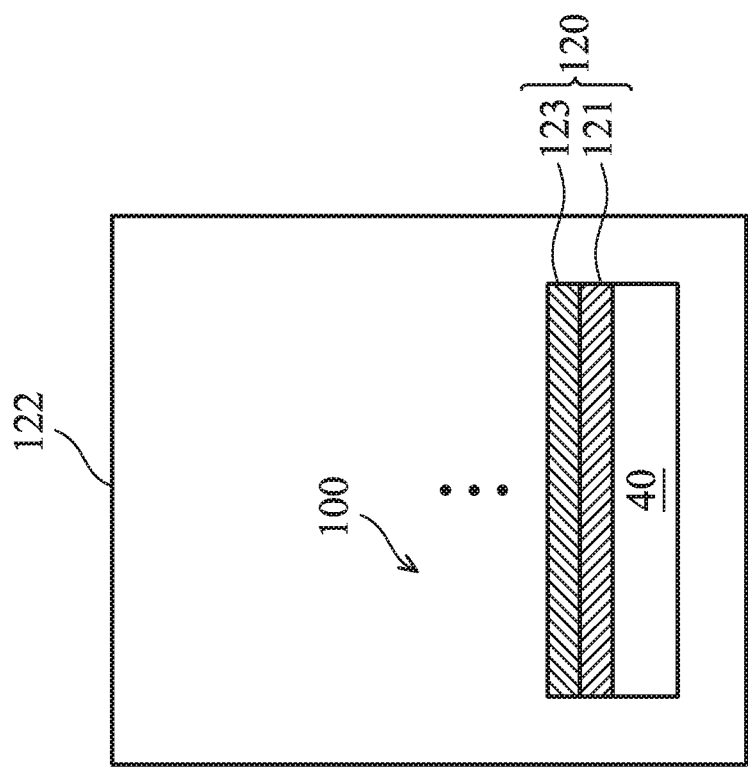

FIGS. 7A and 7B illustrate another gradient ALD process, in accordance with an embodiment. Referring to FIG. 7A, one or more sublayers, such as 121 and 123, are formed over the IMD layer 40 in one or more respective ALD cycles of a first ALD process in a first deposition chamber 122. The process condition of the first ALD process is chosen to facilitate formation of sublayers with lower carbon concentrations (e.g., between about 1 at % and about 15 at %). For example, the temperature in the first deposition chamber 122 is set at a value between about 200° C. and about 300° C., such as 250° C. The precursor gas 216 containing the precursor B, which has lower atomic percentage of carbon, is used in step three of the ALD cycles of the first ALD process, although the precursor gas 214 containing the precursor A may also be used. The first ALD process has four processing steps in each ALD cycle, similar to the ALD process discussed above, in the illustrated embodiment. In the first ALD process, a ratio between the flow rate of the reactant gas 235 (e.g., NH$_3$) used in step one and the flow rate of the precursor gas (e.g., 216) used in step three of each ALD cycle is adjusted to change the carbon concentrations in the sublayers formed.

Still referring to FIG. 7A, in some embodiments, the ratio between the flow rate of the reactant gas 235 and the flow rate of the precursor gas 216 is reduced for each additional sublayer formed, such that a higher sublayer (e.g., further from the IMD layer 40) has a higher concentration of carbon than a lower sublayer (e.g., closer to the IMD layer 40). For example, the sublayer 121 may be formed using a ratio of 95% between the flow rate of the reactant gas 235 and the flow rate of the precursor gas 216, and the sublayer 123 may be formed using a ratio of 90% between the flow rate of the reactant gas 235 and the flow rate of the precursor gas 216. The one or more sublayers formed in the first deposition chamber 122 are collectively referred to as a first diffusion barrier 120. The ratio between the flow rate of the reactant gas 235 and the flow rate of the precursor gas (e.g., 216) may be varied (e.g., decreased for each additional ALD cycle) from about 95% to about 10% in the first deposition chamber 122.

Next, as illustrated in FIG. 7B, the semiconductor device 100 is moved into a second deposition chamber 124, and a second ALD process is performed to form additional sublayers (e.g., 125, 127) over the first diffusion barrier 120. The process condition of the second ALD process is chosen to facilitate formation of sublayers with higher carbon concentrations (e.g., between about 15 at % and about 30 at %). For example, the temperature in the second deposition chamber 124 is set at a value between about 300° C. and about 400° C., such as 350° C. The precursor gas 214 containing the precursor A, which has higher atomic percentage of carbon, is used in step three of the ALD cycles of the second ALD process, although the precursor gas 216 containing the precursor B may also be used. The second ALD process has four processing steps in each ALD cycle, similar to the ALD process discussed above, in the illustrated embodiment. In the second ALD process, a ratio between the flow rate of the reactant gas 235 (e.g., NH$_3$) used in step one and the flow rate of the precursor gas (e.g., 214) used in step three of each ALD cycle is adjusted to change the carbon concentrations in the sublayers formed.

Still referring to FIG. 7B, in some embodiments, the ratio between the flow rate of the reactant gas 235 and the flow rate of the precursor gas 214 is reduced for each additional sublayer formed, such that a higher sublayer (e.g., further from the IMD layer 40) has a higher concentration of carbon than a lower sublayer (e.g., closer to the IMD layer 40). The one or more sublayers formed in the second deposition chamber 124 are collectively referred to as a second diffusion barrier 126. The first diffusion barrier 120 and the second diffusion barrier 126 are collectively referred to as the diffusion barrier 46, and accordingly, the first diffusion barrier 120 may also be referred to as the lower portions of the diffusion barrier 46, and the second diffusion barrier 126 may also be referred to as the upper portions of the diffusion barrier 46. The first ALD process and the second ALD process may also be collectively referred to as a gradient ALD process to form the diffusion barrier 46. The ratio between the flow rate of the reactant gas 235 and the flow rate of the precursor gas (e.g., 214) may be varied (e.g., decreased for each additional ALD cycle) from about 10% to about 0% in the second deposition chamber 124. After the diffusion barrier 46 is formed by the first ALD process and the second ALD process (as illustrated in FIGS. 7A and 7B), a plasma process same as or similar to the plasma process of 109 of FIG. 5C is performed to treat the as-deposited diffusion barrier layer 46.

Figure 8:
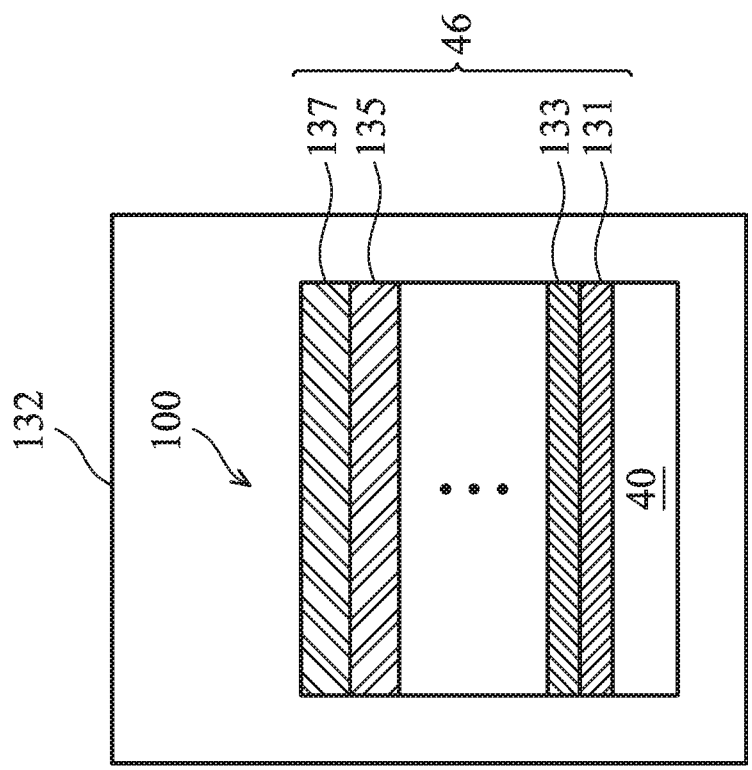
FIG. 8 illustrates a cross-sectional view of a barrier layer of the semiconductor device of FIG. 3, in an embodiment.

FIG. 8 illustrates another embodiment gradient ALD process. The gradient ALD process of FIG. 8 is similar to that of FIGS. 7A and 7B, but with all the sublayers formed in a deposition chamber 132. In some embodiments, a temperature in the deposition chamber 132 is kept a value between about 300° C. and about 400° C., such as 350° C. The gradient ALD process of FIG. 8 has four steps in each ALD cycle, similar to the ALD process discussed above, in the illustrated embodiment. In an embodiment, ammonia (e.g., NH3) is used as the reactant gas 235 (see FIG. 4) in step one, and the precursor gas used in step three of each ALD cycle is 214, 216, or a mixture of 214 and 216 (see FIG. 4). A ratio between the flow rate of the reactant gas and the flow rate of the precursor gas is adjusted (e.g., reduced as additional ALD cycles are performed) from about 600% to about 100% in the deposition chamber 132, such that the carbon concentrations in the sublayers (e.g., 131, 133, 135, and 137) of the diffusion barrier layer 46 increase as the diffusion barrier layer extends away from the IMD layer 40. After the diffusion barrier 46 is formed, a plasma process same as or similar to the plasma process of 109 of FIG. 5C is performed to treat the as-deposited diffusion barrier layer 46.

Figure 9:
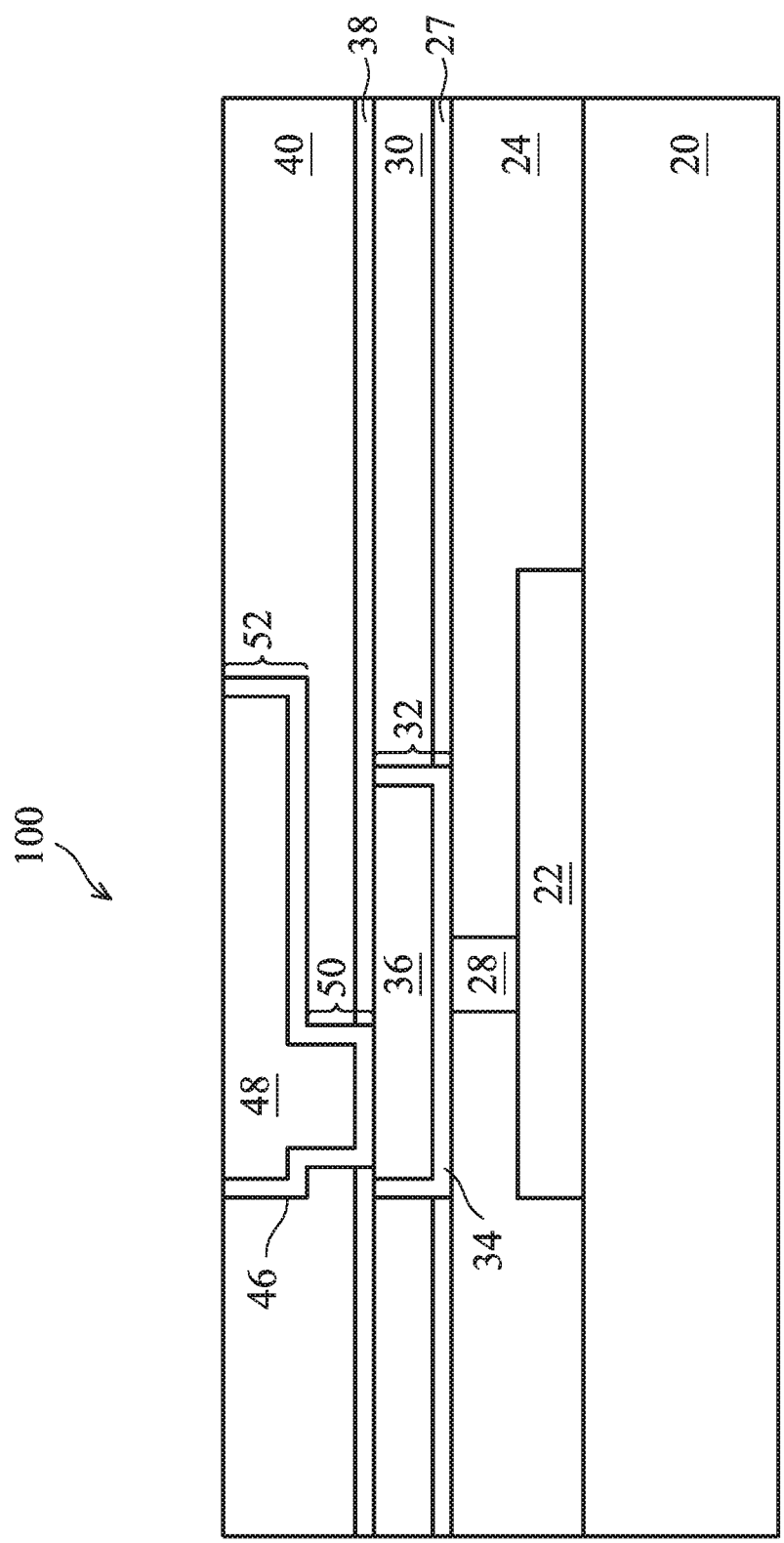
FIGS. 9 and 10 illustrate the cross-sectional views of the semiconductor device of FIG. 3 after additional processing, in an embodiment.

Processing of the semiconductor device 100 continues after the diffusion barrier 46 is formed (see FIG. 3). Referring next to FIG. 9, an electrically conductive material 48, such as copper or a copper-containing material, is formed in the recess comprising the via opening 44 and the trench 42 (see FIG. 2) and fills the recess. Any suitable deposition process, such as plating (e.g., electro-plating, or electro-less plating), CVD, PVD, or the like, may be used to form the conductive material 48. Next, a planarization process, such as CMP, is performed to remove excess portions of the conductive material 48 and the diffusion barrier layer 46 disposed over the upper surface of the IMD layer 40. After the planarization process, the remaining portions of the conductive material 48 and the diffusion barrier layer 46 disposed in the trench 42 form a conductive line 52, and the remaining portions of the conductive material 48 and the diffusion barrier layer 46 disposed in the via opening 44 form a via 50.

Figure 10:
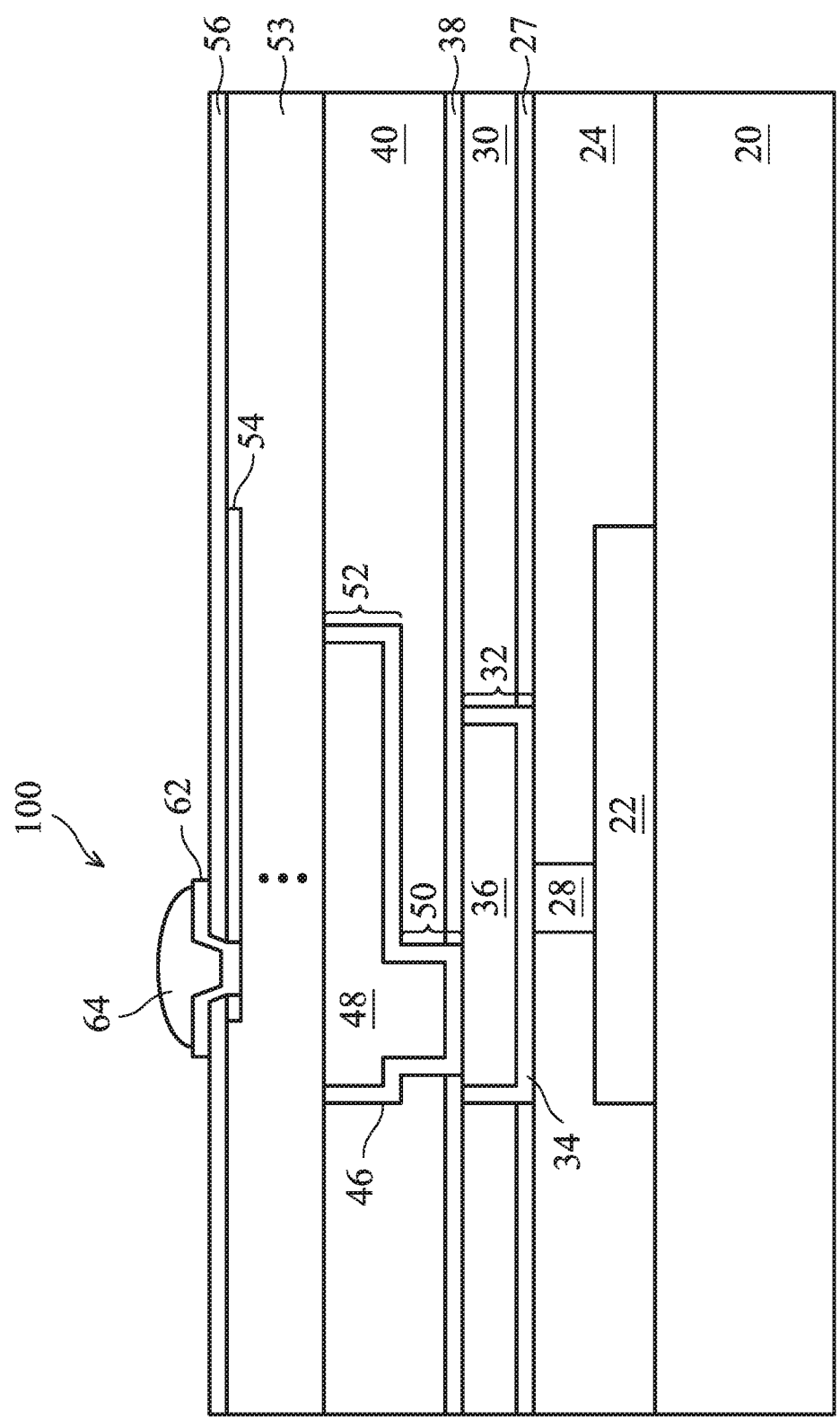

Next, in FIG. 10, one or more IMD layers 53 comprising conductive features (e.g., conductive lines and vias) are formed over the IMD layer 40, using method same as or similar to those discussed above for forming the IMD layer (e.g., 30, or 40) the conducive features (e.g., 36, 48). Next, a passivation layer 56, such as a polymer layer, is formed over the IMD layer 53. After the passivation layer 56 is formed, an under bump metallurgy (UBM) structure 62 is formed over the passivation layer 56 and is electrically coupled to a conductive feature 54 (e.g., a conductive line) of the IMD layer 53.

In an embodiment, the UBM structure 62 comprises three layers of conductive materials, such as a layer of titanium, a layer of copper, and a layer of nickel. However, there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBM structure 62. Any suitable materials or layers of material that may be used for the UBM structure 62 are fully intended to be included within the scope of the present disclosure.

The UBM structure 62 may be formed by: forming an opening in the passivation layer 56 to expose the conductive features 54 in the IMD layer 53; forming a seed layer over the passivation layer 56 and along the interior of the opening in the passivation layer; forming a patterned mask layer (e.g., photoresist) over the seed layer; forming (e.g., by plating) the conductive material(s) in the openings of the patterned mask layer and over the seed layer; removing the mask layer and remove portions of the seed layer on which the conductive material(s) is not formed. Other methods for forming the UBM structure 62 are possible and are fully intended to be included within the scope of the present disclosure.

Still referring to FIG. 10, next, an external connector 64 is formed on the UBM structure 62. In an embodiment, the external connectors 64 is a contact bump such as a controlled collapse chip connection (C4) bump and comprises a material such as tin, or other suitable materials, such as silver or copper. In an embodiment in which the external connectors 64 is a tin solder bump, the external connectors 64 may be formed by initially forming a layer of tin through any suitable method such as evaporation, electroplating, printing, solder transfer, ball placement, or the like. Once a layer of tin has been formed on the structure, a reflow is performed in order to shape the material into the bump shape with a diameter, e.g., of about 80 µm.

However, while the external connectors 64 has been described above as C4 bumps, these are merely intended to be illustrative and are not intended to limit the embodiments. Rather, any suitable type of external contacts, such as ball grid arrays (BGAs), microbumps, copper pillars, a copper layer, a nickel layer, a lead free (LF) layer, an electroless nickel electroless palladium immersion gold (ENEPIG) layer, a Cu/LF layer, a Sn/Ag layer, a Sn/Pb, combinations of these, or the like, may alternatively be utilized. Any suitable external connector, and any suitable process for forming the external connectors, may be utilized for the external connectors 64, and all such external connectors are fully intended to be included within the scope of the embodiments.

Variations to the disclosed embodiments are possible and are fully intended to be included within the scope of the present disclosure. For example, while the diffusion barrier 46 is described as being formed by a gradient ALD process, other barrier layers, such as diffusion barrier layer 34, may also be formed by a gradient ALD process. In addition, while the gradient ALD process uses two precursors (e.g., A and B) in FIG. 4, more than two precursors may be used to provide additional mixing flexibility and/or to achieve a wider range for the carbon concentration. Furthermore, while the embodiments are discussed in the context of forming a tantalum nitride barrier layer with carbon as an impurity, the principle of the present disclosure may be used for other types of barrier layer (comprising other barrier materials) having other types of impurities.

Embodiments may achieve advantages. The gradient ALD processes disclosed herein form a diffusion barrier layer having a gradient in the concentrations of carbon. Particularly, upper sublayers proximate the upper surface of the diffusion barrier layer have higher carbon concentrations, and lower sublayers proximate the underlying dielectric layer have lower carbon concentrations. In a subsequent plasma treatment, the upper sublayers provides protection of the underlying dielectric layer from damage caused by the plasma treatment. The plasms process removes carbon in the diffusion barrier layer, such that the plasma-treated diffusion barrier layer has a substantially uniform density from top to bottom. The plasma treatment also increases the density of the diffusion barrier layer (e.g., due to removal of carbon in the diffusion barrier layer). The uniform density and the higher density of the diffusion barrier layer improve device performance by reducing the resistance of the diffusion barrier layer, and by providing increased protection against barrier functional failure (e.g., copper diffusing through the barrier layer and into the dielectric layer).

Furthermore, the disclosed gradient ALD processes overcome some limitations of existing deposition techniques, and therefore, are especially suited for advanced processing nodes. As feature sizes continues to shrink in advanced processing nodes, it is increasingly hard to form conformal layers (e.g., barrier layers) in small openings having large aspect ratios. While conventional ALD provides improved capability to form conformal layers in small openings, the density of the film (e.g., TaN) formed by the conventional ALD process is low. Low density film may not provide enough thermal budget for subsequent processing, and as a result, copper may penetrate a low density TaN barrier layer, thereby resulting in a barrier functional failure. The presently disclosed gradient ALD processes, together with the subsequent plasma treatment, improve the density of the barrier layer formed, thus preventing or reducing the barrier functional failure. In addition, the barrier layer (with a gradient carbon centration) formed by the gradient ALD processes prevent or reduce plasma induced damage to the underlying dielectric layer (e.g., low-K dielectric layer) in the subsequent plasma processing. Since in time-dependent dielectric breakdown (TDDB) tests, plasma induced low-K dielectric damage may increase the leakage current and decrease the breakdown voltage of the device formed, the current disclosed gradient ALD methods, by preventing or reducing the low-K dielectric damage, improves the device performance by reducing the leakage current and increasing the breakdown voltage.

Figure 11:
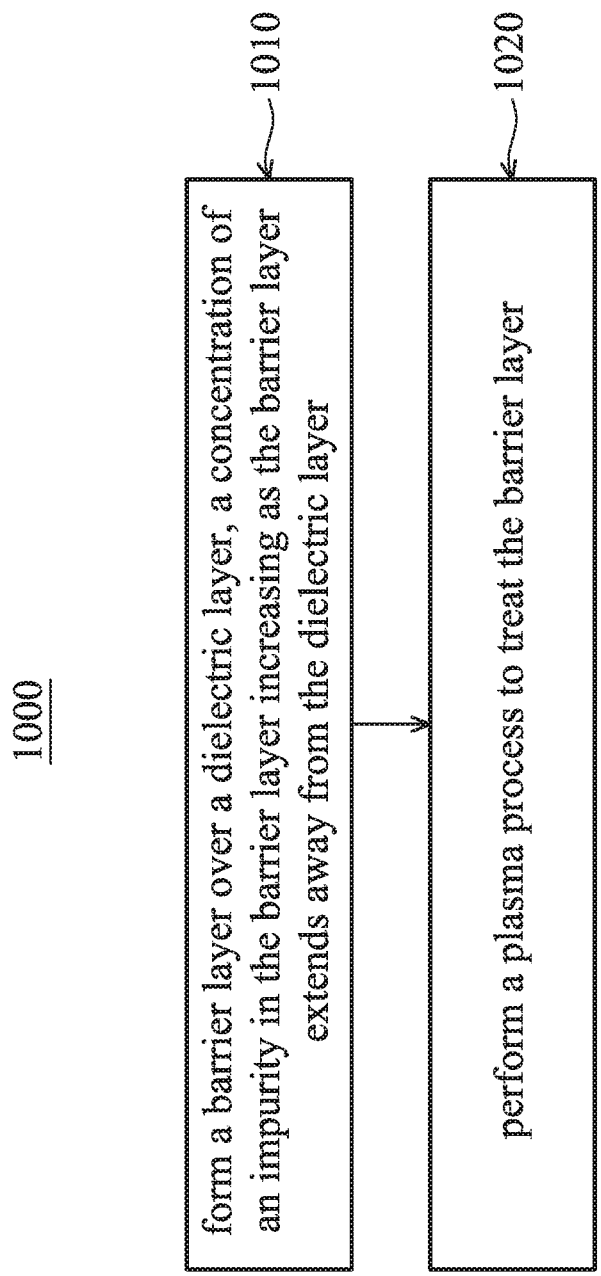
FIG. 11 illustrates a flow chart of a method for forming a semiconductor device, in some embodiments.

FIG. 11 illustrates a flow chart of a method for forming a semiconductor device, in accordance with some embodiments. It should be understood that the embodiment method shown in FIG. 11 is merely an example of many possible embodiment methods. One of ordinary skill in the art would recognize many variations, alternatives, and modifications. For example, various steps as illustrated in FIG. 11 may be added, removed, replaced, rearranged and repeated Referring to FIG. 11, in block 1010, a barrier layer is formed over a dielectric layer, a concentration of an impurity in the barrier layer increasing as the barrier layer extends away from the dielectric layer. In block 1020, a plasma process is performed to treat the barrier layer.

In an embodiment, a method for forming a semiconductor device includes forming a barrier layer over a dielectric layer, a concentration of an impurity in the barrier layer increasing as the barrier layer extends away from the dielectric layer; and performing a plasma process to treat the barrier layer. In an embodiment, the barrier layer includes tantalum nitride, and the impurity is carbon. In an embodiment, forming the barrier layer includes performing an atomic layer deposition (ALD) process. In an embodiment, performing the ALD process includes performing a first ALD cycle to form a first sublayer of the barrier layer; and performing a second ALD cycle to form a second sublayer of the barrier layer over the first sublayer, where a first concentration of the impurity in the first sublayer is lower than a second concentration of the impurity in the second sublayer. In an embodiment, performing the ALD process includes supplying a mixture of a first gas and a second gas into a deposition chamber of the ALD process, the first gas including a first precursor and the second gas including a second precursor, where a first mixing ratio between the first gas and the second gas used for the first ALD cycle is different from a second mixing ratio between the first gas and the second gas used for the second ALD cycle. In an embodiment, an atomic percentage of the impurity in the first precursor is larger than that of the second precursor, where the first mixing ratio is smaller than the second mixing ratio. In an embodiment, each of the first ALD cycle and the second ALD cycle includes a first step, where a reactant gas is supplied to a deposition chamber of the ALD process; a second step, where a purge gas is supplied to the deposition chamber; a third step, where a precursor gas is supplied to the deposition chamber; and a fourth step, where the purge gas is supplied to the deposition chamber, where the first ALD cycle has a first ratio between a flow rate of the reactant gas and a flow rate of the precursor gas, and the second ALD cycle has a second ratio between the flow rate of the reactant gas and the flow rate of the precursor gas, where the first ratio is larger than the second ratio. In an embodiment, after forming the barrier layer and before performing the plasma process, each of the first sublayer and the second sublayer has a respective substantially uniform concentration of the impurity. In an embodiment, the method further includes, after the first ALD cycle and before the second ALD cycle, performing a third ALD cycle to form a third sublayer of the barrier layer, where a third concentration of the impurity in the third sublayer is a same as the first concentration of the impurity in the first sublayer. In an embodiment, forming the barrier layer includes performing a first atomic layer deposition (ALD) process in a first deposition chamber to form lower portions of the barrier layer; and performing a second ALD process in a second deposition chamber different from the first deposition chamber to form upper portions of the barrier layer over the lower portions of the barrier layer. In an embodiment, each of the first ALD process and the second ALD process includes a plurality of ALD cycles and is performed using a reactant gas and a precursor gas, where a ratio between a flow rate of the reactant gas and a flow rate of the precursor gas is changed in each of the ALD cycles of the first ALD process and in each of the ALD cycles of the second ALD process. In an embodiment, the plasma process reduces the concentration of the impurity in the barrier layer. In an embodiment, the barrier layer has a substantially uniform density after performing the plasma process.

In an embodiment, a method includes forming an opening in a dielectric layer; and performing a first atomic layer deposition (ALD) process to form a first barrier layer lining sidewalls of the opening, where performing the first ALD process includes performing a first ALD cycle to form a first sublayer of the first barrier layer, the first sublayer having a first concentration of an impurity; and performing a second ALD cycle to form a second sublayer of the first barrier layer over the first sublayer, the second sublayer having a second concentration of the impurity that is larger than the first concentration of the impurity. In an embodiment, the method further includes treating the first barrier layer using a plasma process, where the plasma process reduces concentrations of the impurity in the first sublayer and in the second sublayer. In an embodiment, performing the first ALD process includes supplying a first precursor and a second precursor at a same time to a deposition chamber of the first ALD process, where a first ratio between a flow rate of the first precursor and a flow rate of the second precursor in the first ALD cycle is different from a second ratio between the flow rate of the first precursor and the flow rate of the second precursor in the second ALD cycle. In an embodiment, the first ALD process is performed in a first deposition chamber, where the method further includes performing a second ALD process in a second deposition chamber different from the first deposition chamber, the second ALD process forming a second barrier layer over the first barrier layer, where performing the second ALD process includes performing a third ALD cycle to form a third sublayer of the second barrier layer, the third sublayer having a third concentration of the impurity; and performing a fourth ALD cycle to form a fourth sublayer of the second barrier layer over the third sublayer, the fourth sublayer having a fourth concentration of the impurity larger than the third concentration of the impurity.

In an embodiment, a method includes forming a low-K dielectric layer over a substrate; removing a portion of the low-K dielectric layer to form an opening in the low-K dielectric layer; performing a first atomic layer deposition (ALD) cycle to form a first sublayer of a barrier layer in the opening, the first sublayer having a first concentration of carbon; performing a second ALD cycle to form a second sublayer of the barrier layer over the first sublayer, the second sublayer having a second concentration of carbon larger than the first concentration of carbon; and treating the first sublayer and the second sublayer using a plasma process, the plasma process reducing the first concentration of carbon and reducing the second concentration of carbon. In an embodiment, the first ALD cycle and the second ALD cycle are performed in a same deposition chamber using a mixture of precursors comprising a first precursor and a second precursor, wherein a first mixing ratio between the first precursor and the second precursor used for the first ALD cycle is different from a second mixing ratio between the first precursor and the second precursor used for the second ALD cycle. In an embodiment, the first ALD cycle and the second ALD cycle are performed in a first deposition chamber and a second deposition chamber, respectively, where the first ALD cycle and the second ALD cycle are performed using a reactant gas and a precursor, where a first flow rate ratio between the reactant gas and the precursor used in the first ALD cycle is different from a second flow rate ratio between the reactant gas and the precursor used in the second ALD cycle.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, the method comprising:
    forming a barrier layer over a dielectric layer by performing an atomic layer deposition (ALD) process, a concentration of an impurity in the barrier layer increasing as the barrier layer extends away from the dielectric layer, wherein performing the ALD process comprises:
    performing a first ALD cycle to form a first sublayer of the barrier layer; and
    performing a second ALD cycle to form a second sublayer of the barrier layer over the first sublayer, wherein a first concentration of the impurity in the first sublayer is lower than a second concentration of the impurity in the second sublayer; and
    performing a plasma process to treat the barrier layer, wherein after forming the barrier layer and before performing the plasma process, each of the first sublayer and the second sublayer has a respective substantially uniform concentration of the impurity.

2. The method of claim 1, wherein the barrier layer comprise tantalum nitride, and the impurity is carbon.

3. The method of claim 1, wherein performing the ALD process comprises supplying a mixture of a first gas and a second gas into a deposition chamber of the ALD process, the first gas comprising a first precursor and the second gas comprising a second precursor, wherein a first mixing ratio between the first gas and the second gas used for the first ALD cycle is different from a second mixing ratio between the first gas and the second gas used for the second ALD cycle.

4. The method of claim 3, wherein an atomic percentage of the impurity in the first precursor is larger than that of the second precursor, wherein the first mixing ratio is smaller than the second mixing ratio.

5. The method of claim 1, wherein each of the first ALD cycle and the second ALD cycle comprises:
    a first step, wherein a reactant gas is supplied to a deposition chamber of the ALD process;
    a second step, wherein a purge gas is supplied to the deposition chamber;
    a third step, wherein a precursor gas is supplied to the deposition chamber; and
    a fourth step, wherein the purge gas is supplied to the deposition chamber, wherein the first ALD cycle has a first ratio between a flow rate of the reactant gas and a flow rate of the precursor gas, and the second ALD cycle has a second ratio between the flow rate of the reactant gas and the flow rate of the precursor gas, wherein the first ratio is larger than the second ratio.

6. The method of claim 1, further comprising, after the first ALD cycle and before the second ALD cycle, performing a third ALD cycle to form a third sublayer of the barrier layer, wherein a third concentration of the impurity in the third sublayer is a same as the first concentration of the impurity in the first sublayer.

7. The method of claim 1, wherein forming the barrier layer comprises:
    performing a first atomic layer deposition (ALD) process in a first deposition chamber to form lower portions of the barrier layer; and
    performing a second ALD process in a second deposition chamber different from the first deposition chamber to form upper portions of the barrier layer over the lower portions of the barrier layer.

8. The method of claim 7, wherein each of the first ALD process and the second ALD process comprises a plurality of ALD cycles and is performed using a reactant gas and a precursor gas, wherein a ratio between a flow rate of the reactant gas and a flow rate of the precursor gas is changed in each of the ALD cycles of the first ALD process and in each of the ALD cycles of the second ALD process.

9. The method of claim 1, wherein the plasma process reduces the concentration of the impurity in the barrier layer.

10. The method of claim 1, wherein the barrier layer has a substantially uniform density after performing the plasma process.

11. A method comprising:
    forming an opening in a dielectric layer; and
    performing a first atomic layer deposition (ALD) process to form a first barrier layer lining sidewalls of the opening, wherein performing the first ALD process comprises:
    performing a first ALD cycle to form a first sublayer of the first barrier layer, the first sublayer having a first concentration of an impurity; and
    performing a second ALD cycle to form a second sublayer of the first barrier layer over the first sublayer, the second sublayer having a second concentration of the impurity that is larger than the first concentration of the impurity, wherein performing the first ALD process comprises supplying a first precursor and a second precursor at a same time to a deposition chamber of the first ALD process, wherein a first ratio between a flow rate of the first precursor and a flow rate of the second precursor in the first ALD cycle is different from a second ratio between the flow rate of the first precursor and the flow rate of the second precursor in the second ALD cycle.

12. The method of claim 11, further comprising:
treating the first barrier layer using a plasma process, wherein the plasma process reduces concentrations of the impurity in the first sublayer and in the second sublayer.

13. The method of claim 11, wherein the first ALD process is performed in a first deposition chamber, wherein the method further comprises:
performing a second ALD process in a second deposition chamber different from the first deposition chamber, the second ALD process forming a second barrier layer over the first barrier layer, wherein performing the second ALD process comprises:
performing a third ALD cycle to form a third sublayer of the second barrier layer, the third sublayer having a third concentration of the impurity; and
performing a fourth ALD cycle to form a fourth sublayer of the second barrier layer over the third sublayer, the fourth sublayer having a fourth concentration of the impurity larger than the third concentration of the impurity.

14. The method of claim 11, wherein the impurity is carbon.

15. The method of claim 12, wherein after performing the first ALD process and before treating the first barrier layer, each of the first sublayer and the second sublayer has a substantially uniform concentration of the impurity.

16. The method of claim 15, wherein the first barrier layer has a substantially uniform density after treating the first barrier layer.

17. The method of claim 12, wherein the plasma process is performed using a gas source comprising argon and hydrogen.

18. A method comprising:
forming a low-K dielectric layer over a substrate;
removing a portion of the low-K dielectric layer to form an opening in the low-K dielectric layer;
performing a first atomic layer deposition (ALD) cycle to form a first sublayer of a barrier layer in the opening, the first sublayer having a first concentration of carbon;
performing a second ALD cycle to form a second sublayer of the barrier layer over the first sublayer, the second sublayer having a second concentration of carbon larger than the first concentration of carbon; and
treating the first sublayer and the second sublayer using a plasma process, the plasma process reducing the first concentration of carbon and reducing the second concentration of carbon.

19. The method of claim 18, wherein the first ALD cycle and the second ALD cycle are performed in a same deposition chamber using a mixture of precursors comprising a first precursor and a second precursor, wherein a first mixing ratio between the first precursor and the second precursor used for the first ALD cycle is different from a second mixing ratio between the first precursor and the second precursor used for the second ALD cycle.

20. The method of claim 18, wherein the first ALD cycle and the second ALD cycle are performed in a first deposition chamber and a second deposition chamber, respectively, wherein the first ALD cycle and the second ALD cycle are performed using a reactant gas and a precursor, wherein a first flow rate ratio between the reactant gas and the precursor used in the first ALD cycle is different from a second flow rate ratio between the reactant gas and the precursor used in the second ALD cycle.

* * * * *